United States Patent [19]

Fujita et al.

[11] Patent Number: 4,717,954
[45] Date of Patent: Jan. 5, 1988

[54] METHOD AND APPARATUS USING A CONVERSION TABLE BASED ON PRE-PRINTED COLOR CHARTS FOR DETERMINING HALF-TONE DOT PERCENTS REQUIRED TO REPRODUCE THE COLOR OF A COLOR SPECIMEN

[75] Inventors: Toshiji Fujita, Niiza; Kazuo Yarita; Toshihiko Hashimoto, both of Tokyo; Masaki Nojima, Urawa, all of Japan

[73] Assignee: Toppan Printing Co., Ltd., Japan

[21] Appl. No.: 608,230

[22] Filed: May 8, 1984

[30] Foreign Application Priority Data

May 10, 1983 [JP] Japan .................. 58-81561

[51] Int. Cl.⁴ .................. G03F 3/08; B41F 00/00; B41M 1/14; G01J 3/52
[52] U.S. Cl. .................. 358/80; 358/75; 101/1; 101/171; 101/211; 250/226; 356/402; 356/419; 356/421
[58] Field of Search .................. 358/75, 75 IJ, 78, 80; 356/402, 405, 406, 407, 408, 416, 417, 418, 419, 420, 421, 422, 423, 424, 425; 250/226; 101/1, 171, 211, DIG. 2

[56] References Cited

U.S. PATENT DOCUMENTS

| | | | |
|---|---|---|---|
| 3,612,753 | 10/1971 | Korman | 358/80 |
| 4,037,249 | 7/1977 | Pugsley | 358/80 |
| 4,060,829 | 11/1977 | Sakamoto | 358/78 |
| 4,075,662 | 2/1978 | Gall | 358/78 |
| 4,275,413 | 6/1981 | Sakamoto et al. | 358/80 |
| 4,334,240 | 6/1982 | Franklin | 358/80 |
| 4,414,635 | 11/1983 | Gass et al. | 358/75 |
| 4,477,833 | 10/1984 | Clark et al. | 358/80 |
| 4,481,532 | 11/1984 | Clark et al. | 358/80 |
| 4,561,016 | 12/1985 | Jung et al. | 358/80 |
| 4,629,428 | 12/1986 | Phillips | 434/98 |

FOREIGN PATENT DOCUMENTS

| | | | |
|---|---|---|---|
| 109936 | 8/1980 | Japan | 356/405 |
| 35116 | 2/1984 | Japan | 356/402 |

OTHER PUBLICATIONS

Condax; Louis M., *Scientific and Technical Usage of Kodak Filters,* Kodak Research Laboratories, 1970, p. 87.

Primary Examiner—James J. Groody
Assistant Examiner—Randall S. Svihla
Attorney, Agent, or Firm—Lerner, David, Littenberg, Krumholz & Mentlik

[57] ABSTRACT

A method and apparatus for obtaining an accurate half-tone dot percent of each color separation where a color designated by a color specimen is to be reproduced by printing of ink of the colors, for example, yellow, magenta, cyan and black. A variety of color charts printed using predetermined combinations of half-tone dot percents are optically measured to obtain color information of the colors printed on the color charts. The obtained color information values together with the corresponding predetermined combinations of half-tone dot percents therefor are then utilized to prepare a conversion table of color information and corresponding half-tone dot percents for reproducing each of the colors printed on the color charts. A color specimen is then optically measured to detect color information of a color to be reproduced. The color information obtained from the color specimen is then successively compared with the color information of the conversion table, and the color information of the conversion table is selected which most closely corresponds to the color information obtained from the color specimen. The combination of half-tone dot percents corresponding to the selected color information from the conversion table is then displayed or otherwise outputted. The outputted combination of half-tone dot percents may then be used to reproduce the color designated by the color specimen. The method and apparatus also provides for interpolation operations if the color information obtained from the specimen does not precisely correspond to the color information in the conversion table. Further, the method and apparatus also provides for generating an expanded conversion table having expanded combinations of half-tone dot percents and corresponding expanded color information, and for performing an interpolation operation if a value of 0% and/or 100% is included in the combination of half-tone dot percents corresponding to the selected color information so as to obtain an interpolated combination of half-tone dot percents corresponding more closely to the color information obtained from the color specimen.

34 Claims, 15 Drawing Figures

FIG.6(a)

| Nos. | Color Density | | | | Half-tone dot percent (%) | | | |
|---|---|---|---|---|---|---|---|---|
| | R Filter | G Filter | B Filter | Amber Filter | C | M | Y | Bk |
| 1 | 0.05 | 0.05 | 0.04 | 0.06 | 0 | 0 | 0 | 0 |
| 2 | 0.16 | 0.11 | 0.06 | 0.13 | 10 | 0 | 0 | 0 |
| 3 | 0.22 | 0.13 | 0.07 | 0.16 | 20 | 0 | 0 | 0 |
| 4 | 0.31 | 0.18 | 0.09 | 0.23 | 30 | 0 | 0 | 0 |
| 5 | 0.41 | 0.22 | 0.10 | 0.29 | 40 | 0 | 0 | 0 |
| 6 | 0.52 | 0.27 | 0.11 | 0.34 | 50 | 0 | 0 | 0 |
| 7 | 0.64 | 0.31 | 0.12 | 0.41 | 60 | 0 | 0 | 0 |
| 8 | 0.76 | 0.36 | 0.14 | 0.47 | 70 | 0 | 0 | 0 |
| 9 | 0.94 | 0.41 | 0.15 | 0.55 | 80 | 0 | 0 | 0 |
| 10 | 1.17 | 0.45 | 0.16 | 0.62 | 90 | 0 | 0 | 0 |
| 11 | 1.53 | 0.52 | 0.17 | 0.71 | 100 | 0 | 0 | 0 |
| 12 | 0.07 | 0.14 | 0.10 | 0.13 | 0 | 10 | 0 | 0 |
| 13 | 0.17 | 0.19 | 0.12 | 0.19 | 10 | 10 | 0 | 0 |
| 14 | 0.25 | 0.22 | 0.14 | 0.24 | 20 | 10 | 0 | 0 |
| 15 | 0.32 | 0.26 | 0.15 | 0.29 | 30 | 10 | 0 | 0 |
| 16 | 0.42 | 0.30 | 0.16 | 0.35 | 40 | 10 | 0 | 0 |
| 17 | 0.52 | 0.34 | 0.17 | 0.41 | 50 | 10 | 0 | 0 |
| 18 | 0.64 | 0.39 | 0.18 | 0.47 | 60 | 10 | 0 | 0 |
| 19 | 0.77 | 0.43 | 0.19 | 0.54 | 70 | 10 | 0 | 0 |
| 20 | 1.94 | 0.48 | 0.20 | 0.61 | 80 | 10 | 0 | 0 |
| 21 | 1.20 | 0.53 | 0.21 | 0.69 | 90 | 10 | 0 | 0 |
| 22 | 1.53 | 0.58 | 0.23 | 0.77 | 100 | 10 | 0 | 0 |
| 23 | 0.07 | 0.21 | 0.15 | 0.18 | 0 | 20 | 0 | 0 |
| 24 | 0.17 | 0.25 | 0.16 | 0.24 | 10 | 20 | 0 | 0 |
| ⋮ | ⋮ | ⋮ | ⋮ | ⋮ | ⋮ | ⋮ | ⋮ | ⋮ |
| 111 | 0.17 | 1.35 | 0.71 | 0.76 | 0 | 100 | 0 | 0 |
| 112 | 0.26 | 1.39 | 0.78 | 0.83 | 10 | 100 | 0 | 0 |
| 113 | 0.34 | 1.41 | 0.79 | 0.89 | 20 | 100 | 0 | 0 |
| 114 | 0.41 | 1.42 | 0.79 | 0.95 | 30 | 100 | 0 | 0 |
| 115 | 0.48 | 1.44 | 0.80 | 1.01 | 40 | 100 | 0 | 0 |
| 116 | 0.62 | 1.49 | 0.81 | 1.12 | 50 | 100 | 0 | 0 |
| 117 | 0.72 | 1.53 | 0.82 | 1.32 | 60 | 100 | 0 | 0 |
| 118 | 0.89 | 1.58 | 0.84 | 1.31 | 70 | 100 | 0 | 0 |
| 119 | 0.98 | 1.59 | 0.84 | 1.37 | 80 | 100 | 0 | 0 |
| 120 | 1.32 | 1.63 | 0.87 | 1.56 | 90 | 100 | 0 | 0 |
| 121 | 1.52 | 1.66 | 0.88 | 1.63 | 100 | 100 | 0 | 0 |

FIG.6 (b)

| Nos. | Color Density | | | | Half-tone dot percent (%) | | | |
|---|---|---|---|---|---|---|---|---|
| | R Filter | G Filter | B Filter | Amber Filter | C | M | Y | Bk |
| 122 | 0.07 | 0.07 | 0.14 | 0.07 | 0 | 0 | 10 | 0 |
| 123 | 0.17 | 0.13 | 0.16 | 0.14 | 10 | 0 | 10 | 0 |
| 124 | 0.24 | 0.16 | 0.16 | 0.18 | 20 | 0 | 10 | 0 |
| 125 | 0.33 | 0.20 | 0.17 | 0.24 | 30 | 0 | 10 | 0 |
| 126 | 0.41 | 0.24 | 0.18 | 0.29 | 40 | 0 | 10 | 0 |
| 127 | 0.51 | 0.28 | 0.19 | 0.35 | 50 | 0 | 10 | 0 |
| 128 | 0.64 | 0.33 | 0.21 | 0.43 | 60 | 0 | 10 | 0 |
| 129 | 0.74 | 0.37 | 0.22 | 0.48 | 70 | 0 | 10 | 0 |
| 130 | 0.96 | 0.44 | 0.23 | 0.58 | 80 | 0 | 10 | 0 |
| 131 | 1.21 | 0.50 | 0.25 | 0.67 | 90 | 0 | 10 | 0 |
| 132 | 1.64 | 0.56 | 0.26 | 0.77 | 100 | 0 | 10 | 0 |
| 133 | 0.08 | 0.16 | 0.20 | 0.14 | 0 | 10 | 10 | 0 |
| 134 | 0.17 | 0.21 | 0.21 | 0.20 | 10 | 10 | 10 | 0 |
| 135 | 0.24 | 0.23 | 0.21 | 0.24 | 20 | 10 | 10 | 0 |
| ⋮ | ⋮ | ⋮ | ⋮ | ⋮ | ⋮ | ⋮ | ⋮ | ⋮ |
| 242 | 1.51 | 1.57 | 0.89 | 1.61 | 100 | 100 | 10 | 0 |
| ⋮ | ⋮ | ⋮ | ⋮ | ⋮ | ⋮ | ⋮ | ⋮ | ⋮ |
| 1331 | 1.51 | 1.60 | 1.36 | 1.61 | 100 | 100 | 100 | 0 |
| ⋮ | ⋮ | ⋮ | ⋮ | ⋮ | ⋮ | ⋮ | ⋮ | ⋮ |
| 14641 | 1.53 | 1.60 | 1.51 | 1.70 | 100 | 100 | 100 | 100 |

METHOD AND APPARATUS USING A CONVERSION TABLE BASED ON PRE-PRINTED COLOR CHARTS FOR DETERMINING HALF-TIME DOT PERCENTS REQUIRED TO REPRODUCE THE COLOR OF A COLOR SPECIMEN

FIELD OF THE INVENTION

This invention relates to a method of obtaining half-tone dot percents of color separations of C (cyan), M (magenta), Y (yellow) and Bk (black) for carrying out printing in accordance with color information obtained by optically measuring a color specimen.

BACKGROUND OF THE INVENTION

In order that an orderer may pre-assign colors for a certain portion of printed matter, a small sheet of paper for assigning colors called a color specimen has sometimes been attached to a layout. For example, in the case where a background of a picture is desired to be evenly painted with a specific color, a small sheet of paper painted with the color of said background is attached as a color specimen and is sent to a printing factory.

The printing factory employs a four-color printing system using color separations of C, M, Y and Bk, which is the commonest multicolor printing system, and decides what percent of half-tone dot percents of color separations of C, M, Y and Bk should be used to print the assigned portion with the same color as that of the color specimen before preparation of color separations under such conditions and printing.

In the past, the above-described work includes: preparing a color chart which is an assembly of a multiplicity of printed matters, said color chart being printed with half-tone dot percents of color separations of C, M, Y, and Bk varied at intervals of about 10%; visually comparing the color specimen with colors on the color chart by an operator to select a color most approximate to the color specimen from the color chart; utilizing the fact that half-tone dot percents of color separations necessary for printing colors in the color chart are described in the color chart to fine half-tone dot percents of color separations necessary for printing said selected color; preparing color separations having said half-tone dot percents; and reproducing colors assigned by the color specimen.

However, this method has many disadvantages, because the work requires manual operations, the kinds of colors in the color chart are very great in number, comparison work for comparing colors in the color chart with the color specimen takes much time, and the colors selected from the color chart differ depending on operators, and thus, irregularities in colors to be reproduced tend to occur.

On the other hand, a reflection densitometer is now commercially available which can measure density of an article to be measured to figure out a half-tone dot percent. According to this densitometer, the measured value of density is processed by a computer housed in the densitometer to calculate a half-tone dot percent.

In this densitometer, a Yule-Nielsen's equation is used to calculate a half-tone dot percent. However, the scope of application of the Yule-Nielsen's equation has a limitation.

That is, this equation is based on the assumption that the relation with a standard density of half-tone dot percent 100% is utilized, and therefore, only the color having said standard density can be applied thereto and, in addition, the equation can be normally used only when an article to be measured has a mono-color. Moreover, this equation is realized by the fact that dots are reproduced ideally without dot gains or the like and that the coefficients may vary due to factors of screen rulings, density, and quality of paper. Therefore, in actual use, even with a mono-color it is not possible to accurately obtain half-tone dot percents in a wide range such as from a light area to a shadow area. Further, it is impossible to calculate half-tone dot percents for more than a secondary color.

Accordingly, such a densitometer cannot be used for work for obtaining half-tone dot percents of color separations of C, M, Y and Bk which can reproduce colors assigned by the color specimen.

Also, with a conventional densitometer as described, it is not possible to accurately obtain half-tone dot percents of color separations for reproducing colors on the color specimen for the following additional reasons.

That is, printing ink of C, M and Y are not ideal, and an M component and a Y component are included in C ink, a C component and a Y component are included in M ink, and a C component and a M component are included in Y ink.

For example, suppose that an image of half-tone dot percent 100% is printed with only C ink of certain ink makers. When densities of C, M and Y of this printed matter are obtained through R (red) filter, G (green) filter and B (blue) filter, respectively, they are 1.53, 0.52 and 0.17, respectively, and despite the fact that printing is made only with C ink, and M component and a Y component are included. When the Yule-Nielsen's equation is used to obtain a half-tone dot percent, the half-tone dot percent of each color separation will have the value thus corresponding to the aforesaid density value, failing to obtain a proper half-tone dot percent. Such a phenomenon becomes more complicated in case of a printed matter in which ink of plural colors are printed.

It can be understood even from the above-described reason that the densitometer using the Yule-Nielsen's equation cannot be applied to the afore-mentioned work.

Some of the colors assigned by the color specimen are not present in the color chart. It is well known that bright colors among the secondary colors, for example, such as green, orange, purple and the like are difficult to reproduce in color-printing with ordinary process ink.

This largely results from the fact that chromaticity of process ink is relatively strained as compared with chromaticity of the theoretical three primary colors for the reasons of economy, printability, light-resistance, water resistance and the like, and therefore, turbidity arises. When such a color is compared with ones on the color chart to compare it with a color which seems to be closest thereto, then, the color would be judged to be a color which is perceived as being difficult to reproduce. However, it is not possible to quantitatively grasp to what extent the color cannot be reproduced.

Accordingly, in actual work, a color which appears closest is selected out of the color chart, and half-tone dot percents of color separations are corrected so as to make that color approximate to that of the color specimen by retouching work before printing. However, it is often encountered that when the results of printing are checked, the reproduced color is greatly different from the color of the color specimen and the half-tone dot percents have to be changed. Considerable cost of material and loss of time result for such procedure. This problem is impossible to solve as long as one relies upon work by hand and upon the aforesaid densitometer.

OBJECT OF THE INVENTION

This invention has been achieved in an attempt to solve these problems noted above with respect to the prior art. An object of the invention is to provide a method which can obtain accurate half-tone dot percents of color separations where colors assigned by color specimens are reproduced by pringing with ink of colors, for example, Y, M, C and Bk.

It is another object of the invention to provide a method which can obtain accurate half-tone dot percents of color separations, even in the case where the colors assigned by the color specimens are not a monocolor, such as a secondary color or a tertiary color, necessary for reproduction of such colors.

It is still another object of the present invention to provide a method wherein the colors assigned by the color specimens are those which are difficult to reproduce by printing using ink of colors, for example, Y, M, C and Bk, and the extent of the difficulty of reproduction can be known quantitatively.

SUMMARY OF THE INVENTION

To achieve the aforementioned objects, in accordance with the present invention, a variety of combinations of half-tone dot percents of color separations and color information, obtained by optically measuring printed matter actually printed by said color separations, are obtained to prepare a conversion table of color information and corresponding half-tone dot percents. A color specimen is optically measured to obtain color information of color to be printed. Color information obtained from said color specimen and color information of said conversion table of color information and corresponding half-tone dot percents are compared to select color information most approximate to color information obtained from said color specimen. A half-tone dot percent corresponding to said selected color information is obtained by making use of said table, the value of the half-tone dot percent of the obtained color separation being displayed on a display or being directly inputted into an external device such as a color scanner to use the same as data for preparing color separations.

BRIEF DESCRIPTION OF THE DRAWINGS

The nature, principle and details of the invention will be more clearly apparent from the following detailed description with respect to preferred embodiments of the invention with reference to the accompanying drawings, in which:

FIGS. 6(a) and 6(b) illustrate one example of the conversion table of color density and corresponding half-tone dot percents stored in ROM;

DETAILED DESCRIPTION OF THE INVENTION

In the following, preferred embodiments of this invention will be described in detail with reference to the drawings.

Figure 1:
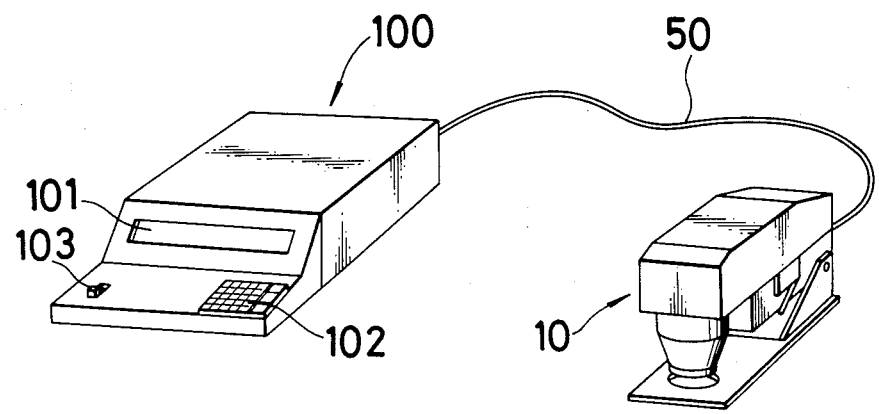
FIG. 1 is an overall view of apparatus which can carry out the method in accordance with the present invention.

An apparatus used to carry the method of the present invention into effect is shown in FIG. 1 in the form of an overall view. It will be understood that a measuring head 10 is connected to a body 100 by a cable 50.

The body 100 houses an operation circuit which performs data processing which will be described later, and the body 100 has a display device 101 and a keyboard 102, which are electrically connected to the operation circuit, arranged on the front surface thereof. A reference numeral 103 designates a main switch which turns a power source ON and OFF.

For the display device 101, a liquid crystal display (LCD), a fluorescent display tube, a cathode ray tube (CRT) or the like can be used, and various indication keys, ten-keys (i.e., keys marked with numerals "0"–"9") or the like, are arranged on the keyboard 102.

Figure 3:
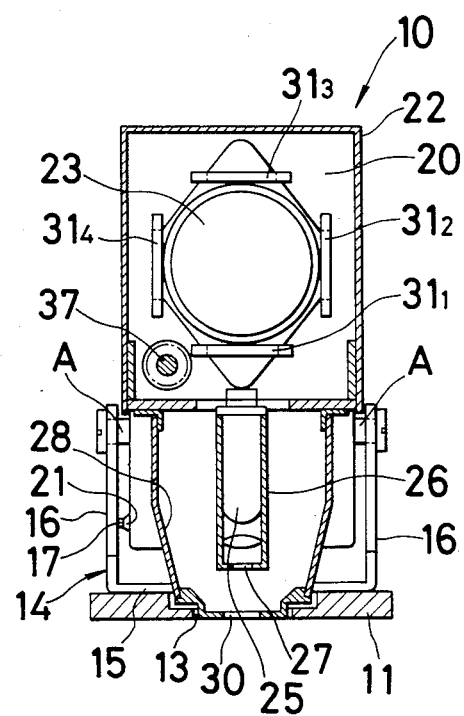
FIG. 3 is a front view showing the construction of the measuring head of the apparatus shown in FIG. 1.
Figure 2:
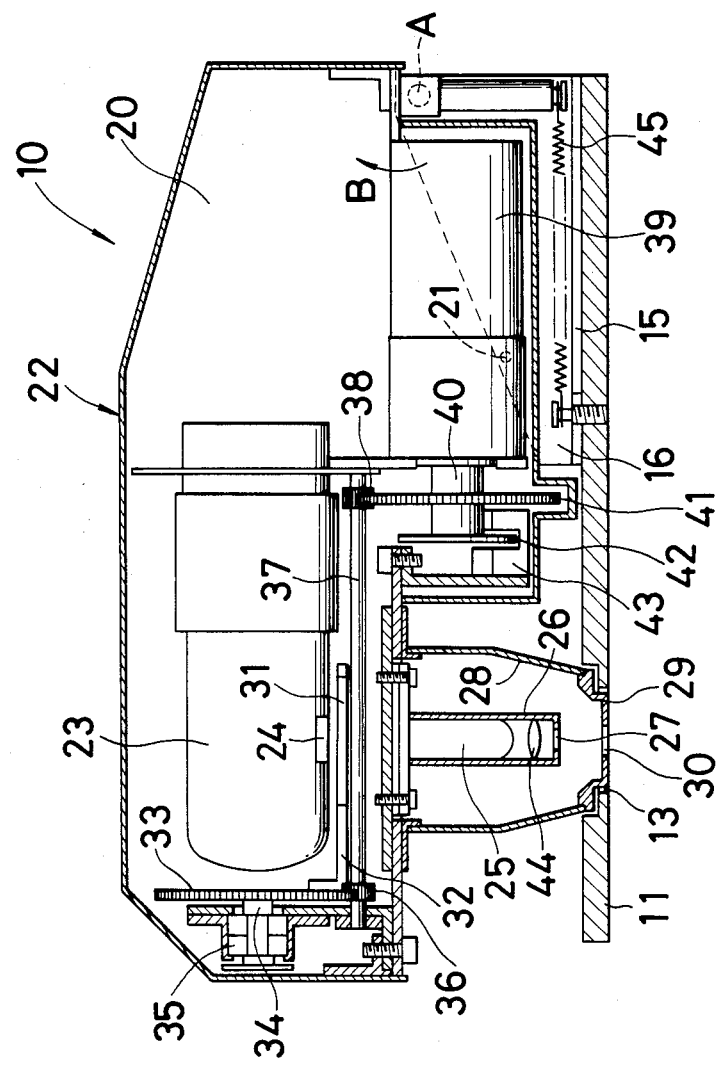
FIG. 2 is a side view showing the construction of a measuring head of the apparatus shown in FIG. 1.

The measuring device 10 comprises a base plate 11 and a movable body 20 as shown in FIGS. 2 and 3. The base plate 11 is preferably formed of transparent hard plastic or the like such as acrylic plastic. The base plate is formed in the neighborhood of one end edge thereof with a measuring hole 13 and has a jig 14 for mounting and movable body secured in the neighborhood of the other end thereof. The jig 14 comprises a bottom plate 15 in contact with the base plate 11 and side plates 16, 16 stood upright on both sides thereof. The movable body 20 is rotatably mounted at a point A in the vicinity of the top of the side plates 16, 16. Internally of these two side plates 16, 16 is provided a projection 17 for depressing a limit switch 21 mounted on the side of the movable body 20. The whole movable body 20 is covered with a housing 22, within which a measuring device is accommodated. A reference numeral 23 designates a photomultiplier tube and a light receiving surface 24 thereof downwardly faces therefrom. Below the photo-multiplier tube 23 are disposed a light source 25 and a condenser lens 44, which are accommodated within a cylindrical case 26, and an illuminating hole 27 is provided in the lower surface of the cylindrical case 26 so that the light source 25 may illuminate a portion directly there-under. In the circumference of the light source 25 there is arranged a conical reflecting plate 28 connecting to the housing 22, and on the lower end thereof is mounted an objective ring 29 which has a shape so that an outer circumference thereof is fitted into the hole 13. A hole 30 of the ring 29 is designed so as to have a dimension which is equal to or somewhat larger than the size of an illumination spot formed by the light source 25. Immediately before the light receiving surface 24 of the photo-multiplier 23, a plurality of filter holding plates 32 are mounted on a gear 33, said holding plates 32 holding and successively positioning various filters 31, which are in the illustrated embodiment, an R (red) filter $31_1$, a G (green) filter $31_2$, a B (blue) filter $31_3$ and an amber filter $31_4$. In this embodiment, four filter holding plates 32 are mounted on the gear 33, for four kinds of filters which are used.

The gear 33 is secured to a rotary shaft 34 supported by bearings 35, and rotation thereof is transmitted by rotation of a rotary shaft 37 of a gear 36 meshed with the gear 33. Transmitted to the rotary shaft 37 is a rotational force of a motor 39 by a gear 41 mounted on a rotary shaft 40 of the motor 39 through a gear 38 mounted in the vicinity of one end of the rotary shaft 37.

A disc 42 for controlling the amount of rotation of the motor 39 is fixedly mounted on the rotary shaft 40. The disc 42 is bored, in the vicinity of the circumference thereof, to make a hole with a spacing which can rotate the gear 33 by ¼ of one rotation to position the filters 31 immediately before the light receiving surface 24. A light projecting and receiving element 43 is provided to detect said hole.

To measure color information of a color specimen which is one kind of printed matter by the measuring head constructed as described above, the base plate 11 is first set so that a color specimen to be measured may be exposed from the hole 13. Normally, the movable body 20 is rotated about the point A by means of a compressive force of a spring coil 45 from the position shown in FIG. 2 in a direction as indicated by arrow B whereby the objective ring 29 is raised from the base plate 11. From said position, the movable body 20 is depressed and then the lower surface of the objective ring 29 comes into contact with the color specimen to intercept invasion of external light, at which time the limit switch 21 is depressed by the projection 17 and turned on whereby measuring starts. The light of the light source 25 illuminates only the color specimen exposed from the hole 30 and the reflecting light from the color specimen is reflected by the reflecting plate 28. The light passes through the filters 31, reaches the light receiving surface 24 of the photo-multiplier 23 and is converted into an electrical signal corresponding to the intensity of light. After measuring has been terminated with respect to one filter $31_1$, a central processing unit (CPU) provides a filter changing signal, and the motor 39 is rotated in accordance with the aforesaid signal. When the hole of the disc 42 is detected by the light projecting and receiving element 43, the rotation of the motor 39 stops whereby the gear 33 is rotated by ¼ and the next filter $31_2$ assumes a position immediately before the light receiving surface 24 for accomplishment of measurement again in a manner similar to that described previously. Such an operation is repeatedly carried out till measurement of reflected light of the color specimen through all of four filters $31_1$, $31_2$, $31_3$ and $31_4$, and thereby electric signals corresponding to the magnitude of color components of the color specimen, are obtained.

Figure 4:
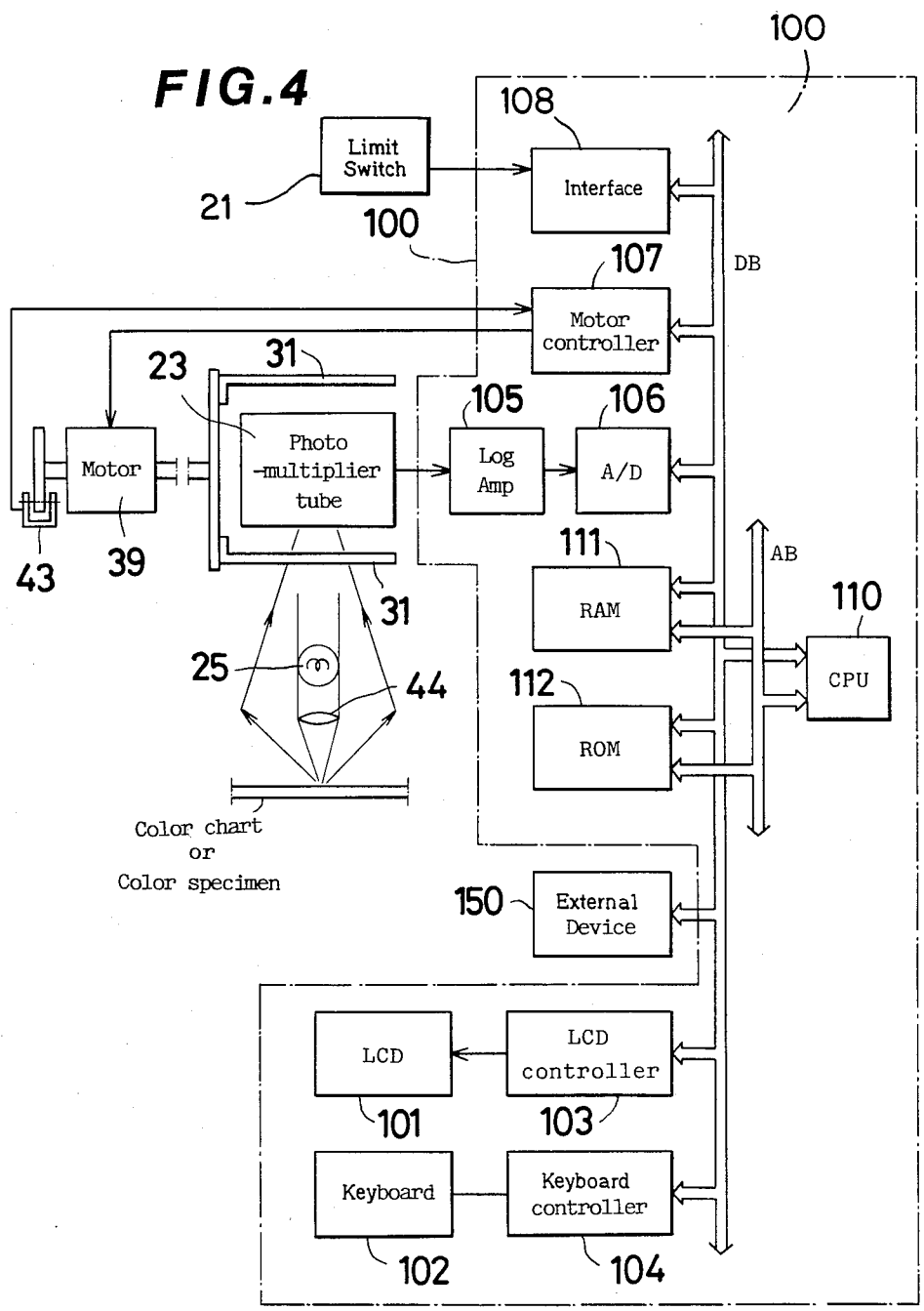
FIG. 4 is a block diagram of an electric circuit of the apparatus shown in FIG. 1.

FIG. 4 is a block diagram for explaining the electric circuit of the apparatus shown in FIG. 1.

The reflected light of the color chart or color specimen illuminated by the light source 25 passes through the optical filter 31, and only the light of specific color component is received by the photo-multiplier 23 and is converted into an electric signal corresponding to the magnitude of the amount of received light. A log amplifier 105 is connected to the photo-multiplier 23, and in the log amplifier 105, the electric signal is converted into color density.

It will be noted that as means for representing colors, chromaticity or the like represented by XYZ system or L*a*b* system can be used in place of the aforesaid color density, in which case, a different circuit construction becomes necessary. The color density signal is converted into digital data by an A-D converter and is inputted into CPU 110 through data bus DB.

Connected to the CPU 110 through the data bus DB are a micro-switch 21, a motor controller 107, a random access memory (RAM) 111, a read only memory (ROM) 112, a liquid crystal display (LCD) controller 103 and a keyboard controller 104, which are presented within the body 100 or being provided on the body 100.

The motor controller 107 causes a motor 39 to rotate in accordance with a command from the CPU 110 and causes the motor 39 to stop upon receipt of a signal from a light projecting and receiving element 43.

A liquid crystal display (LCD) 101 is controlled by the liquid crystal display controller 103 and displays the results of operation made by the CPU 110. A keyboard 102 is provided to give the CPU 110 data inputs such as data of half-tone dot percent of the color chart or various commands. The interface 108 is connected with a limit switch 21.

A reference numeral 150 designates an external device such as a scanner, into which the obtained half-tone dot percents of the various color separations can also be inputted.

Data fed into the CPU or results operated by the CPU are stored in RAM 111 through an address bus AB with an address to be stored for RAM 111 or ROM 112 assigned by the CPU 110.

A combination of color densities of the measured specimen, for example, is stored in RAM 111, and programs for actuating, for example, CPU 110, a conversion table of color information (e.g. color density) and corresponding half-tone dot percents or the like is stored in ROM 112.

Next, the method in accordance with the present invention which uses an apparatus as described above will be explained. Various steps of this method are carried out by commands of the central processing unit (CPU) operated by programs.

First, in accordance with the present invention, a table in which color densities of a color chart and half-tone dot percents are combined is prepared, and stored in memory means (ROM 112). In preparing this table, ink of colors, Y, M, C and Bk are used, and the half-tone dot percent of each color separation is varied in suitable spacing between 0% and 100%, 10% in this embodiment, and actual printing is carried out to prepare a color chart. For kinds of color charts resulting from variation in half-tone dot percents as described above, there are $11^4 = 14,641$ kinds of combinations.

Figure 5:
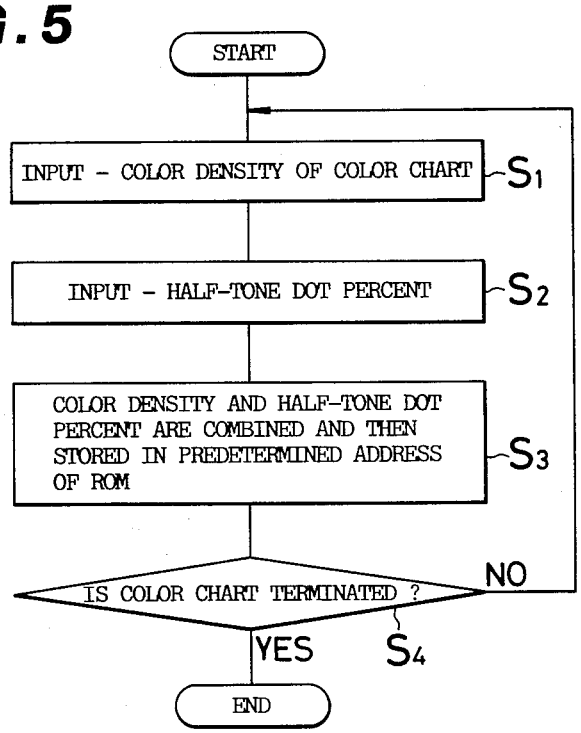
FIG. 5 is a flow chart showing the operation of preparing a conversion table of color density and corresponding half-tone dot percents.

As shown in FIG. 5, a combination of color densities of a color chart is actually successively obtained by the measuring head 10 through the R filter, G filter, B filter and amber filter (an ND filter can be used) (Step $S_1$). Next, a combination of half-tone dot percents (which is already known since it is described on the color chart) of each color separation is inputted from the keyboard 102 (Step $S_2$). The combination of the color densities and the combination of half-tone dot percents are stored in paired relation into a predetermined address of ROM 112 (Step $S_3$). Such processing is carried out for all the color charts (Step $S_4$). As the result, within the ROM 112 is prepared a conversion table of color density and corresponding half-tone dot percents (hereinafter, "color density—half-tone dot percent") showing the corresponding relation of color densities of color charts and half-tone dot percents of color separations as shown in FIGS. 6(a) and 6(b). In accordance with the conversion table of color density—half-tone dot percent shown in FIGS. 6(a) and 6(b), from number 1 to number 11, color separations of M, Y and Bk are 0% in half-tone dot percent and only the C is varied at intervals of 10% between 0% and 100%. From number 12 to number 22, color separations of Y and Bk are 0% in half-tone dot percent, the M is 10% in half-tone dot percent, and only the C is varied at intervals of 10% between 0% and 100%. And, color separation of Y, M, C and Bk are varied in half-tone dot percent at intervals of 10%. It will be understood that printing is carried out in the mode as just described to obtain a combination of color densities through the R filter, G filter, B filter and amber filter corresponding to each color chart.

It is noted that the measurement of color density through the amber filter need not always be performed but the measurement can be performed by three filters, R filter, G filter and B filter to make a conversion table of color density—half tone dot percent having three kinds of color densities.

Also, a means for storing the conversion table of color density—half-tone dot percent is not limited to a ROM used in this embodiment but a magnetic disc, a floppy disc or the like can be used.

Figure 7:
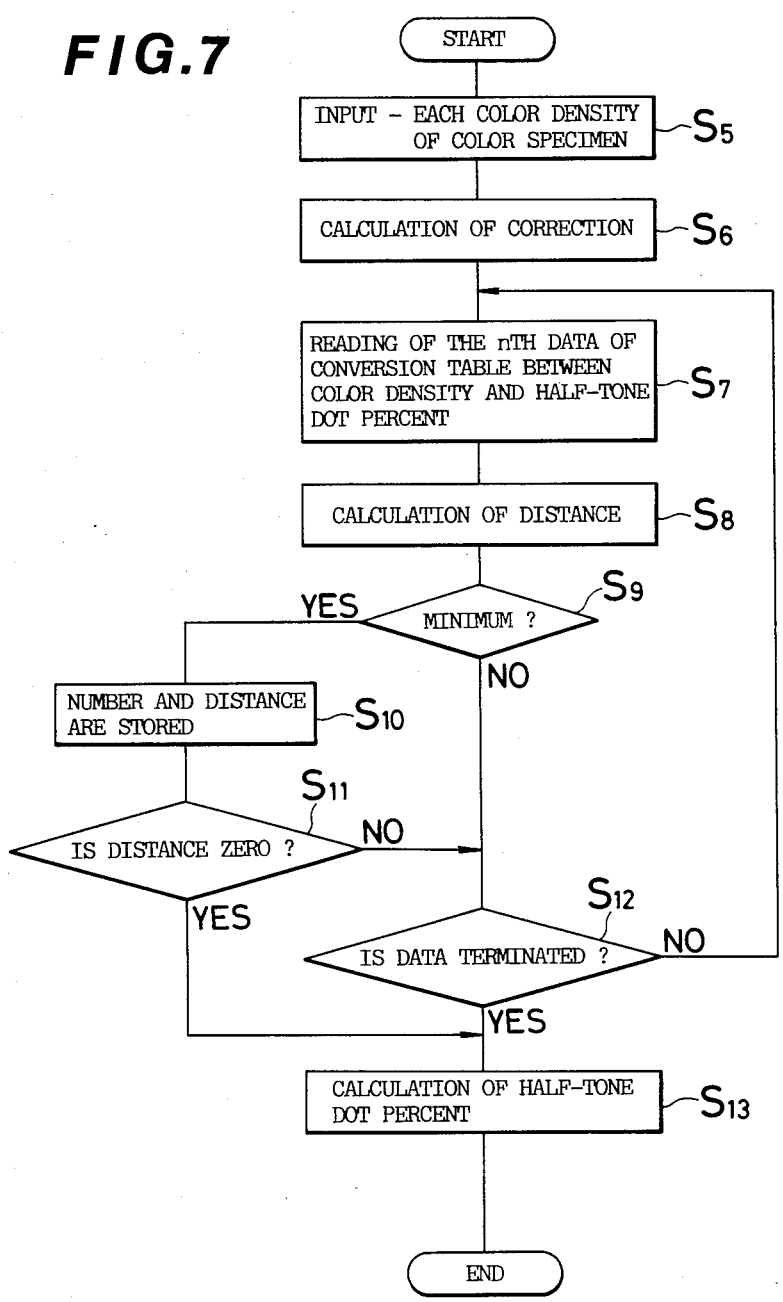
FIG. 7 is a flow chart showing the operation of the process in accordance with the method of the present invention.

After the conversion table of color density—half-tone dot percent has been prepared, the half-tone dot percent of color separations (Y, M, C and Bk) of color specimens are obtained, according to the step shown in FIG. 7.

First, a color specimen is put under the base plate 11 of the measuring head 10, and color densities of the color specimen are measured through the R filter, G filter, B filter and amber filter in accordance with the aforementioned measuring operation. The filters used for this measurement and the filters used when the conversion table of color density—half-tone dot percent have to be one and the same. Each color density is inputted into the CPU (Step $S_5$), and a correction calculation is performed with respect to the value thereof (Step $S_6$).

The correction calculation is performed for the following reason.

That is, there sometimes occurs a case where a paper for a color chart used to prepare the conversion table of color density—half-tone dot percent is different in kind from a paper actually used to effect printing in a printing factory. There also sometimes occurs a case where a tone reproducing curve and a dot 100% density value which are standardized when a color chart is printed to prepare a conversion table of color density—half-tone dot percent are different from those which are standardized in the printing factory in the event that printing is actually performed in the printing factory. In such cases, the conditions when a color chart is printed to prepare a conversion table of color density—half-tone dot percent are different from those when printing is actually performed. In this case, the correction calculation is performed in an attempt to remove the bad influence resulting from the difference between both the conditions so as to obtain a proper half-tone dot percent.

Figure 8:
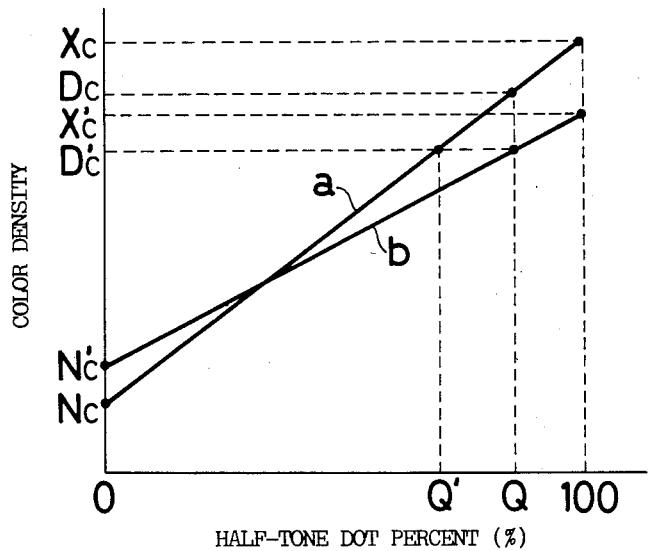
FIG. 8 is a view for explaining the method of correction calculation.

One example of the correction calculation will be described with reference to FIG. 8. FIG. 8 is a graphic representation for explaining the relation between the color density and the half-tone dot percent, the axis of ordinate being the color density while the axis of abscissa being the half-tone dot percent. While in the following explanation, a description will be made on the assumption that these are in a linear relation, it will be appreciated that, even for curves, a similar way of thinking can be applied to effect correction.

In FIG. 8, it is assumed that color density Xc is obtained by measuring a color chart wherein only the C separation is 100% and all the others are 0% when a conversion table of color density—half-tone dot percent is prepared through the R filter which is in the relation of a complementary color to the C separation, and color density Nc are obtained through the R filter of a color chart in which all separations are 0%, that is, a portion in which no ink is applied to a paper of the color chart. Further, a paper to be printed actually is printed beforehand by use of the dot 100% C separation with the density which is determined as the standard dot 100% density in the printing factory. It is assumed that color density X'c is one obtained by measuring the dot 100% density of the C separation applied to the paper to be printed actually by the aforementioned measuring head 10 through the R filter, and color density N'c is one obtained by measuring the paper, which is not printed, through the R filter in a similar manner. In FIG. 8, the straight lines (a) and (b) respectively indicate the relation between the color density and the half-tone dot percent when a conversion table of color density—half-tone dot percent is prepared and when actual printing is performed, respectively. In this case, if D'c is the color density obtained through the R filter, when a half-tone dot percent is obtained without making any correction, the half-tone dot percent Q' is obtained, which is however different from the half-tone dot percent Q which has to be obtained actually. Thus, the color density value of the color specimen will be corrected in the following manner in order to correct an error at that case. That is, where Dc represents the color density after the value of the color density D'c obtained by measuring the color specimen through the R filter has been corrected, the color density of the color specimen obtained by the following equation through the R filter is corrected:

$$Dc = (D'c - N'c) \times \frac{Xc - Nc}{X'c - N'c} + Nc$$

Similarly, where only the M separation is 100%, only the Y separation 100% and only the Bk separation 100%, the color densities are obtained beforehand through the G filter, B filter and amber filter, respectively and further the color density of the paper itself is obtained before the G filter, B filter and amber filter.

The color specimen is corrected using these color density data with respect to the color densities obtained through the G filter, B filter and amber filter, and the thus corrected color densities Dc, DM, DY and DBk are used for comparison with the color densities in the conversion table of color density—half-tone dot percent.

While in the above-described example of correction, the color density of the paper used for actual printing and color densities of the dot 100% printing portion of each color ink have been actually measured to obtain correcting data, where these data are pre-obtained, such data can be inputted by the keyboard or the like.

Moreover, as another method of correction, where a means is employed in which a light area and a shadow area can be adjusted independently for every filter, R, G, B and amber, as a means for measuring color densities, the following method can be taken. That is, for the light area, a portion not printed on a paper to be printed actually is measured, and densities are adjusted through filters, R, G, B and amber so that C, M, Y and Bk of the conversion table of color density—half-tone dot percent are respectively 0% color density (which is the case of number 1 in FIG. 6($a$)). For the shadow area, papers C, M, Y and Bk to be printed which are printed with the dot 100% density to be standardized for eac color ink are prepared. A portion of the dot 100% density of C ink is measured through the R filter, and the color density of the shadow area is adjusted so as to have the color density of R filter where the C of the conversion table of color density—half-tone dot percent is 100% (which is the case of number 11 in FIG. 6($a$)). Similarly, M ink, Y ink and Bk ink are also measured through the G filter, B filter, and amber filter so as to have color densities of the G filter, B filter and amber filter where the color separations of Y, M and Bk of the conversion table of color density—half-tone dot percent is 100%. After such adjustment has been made, the actual color specimen is measured to obtain a combination of half-tone dot percent.

The thus corrected color density of the color specimen is compared with the color densities of the conversion table of color density—half-tone dot percent. That is, color density data are read from number 1 thereof into CPU 110 from the conversion table of color density—half-tone dot percent which is being stored in ROM shown in FIG. 7 (Step $S_7$), and the distance calculation relative to each color density of color specimen is performed (Step $S_8$).

The distance calculation is performed in the following manner, if an equation is used.

Let $D_R$, $D_G$, $D_B$ and $D_A$ be the densities obtained through the R filter, G filter, B filter and amber filter, respectively, of the color specimen, and let $T_R(n)$, $T_G(n)$, $T_B(n)$ and $T_A(n)$ be the color densities through the R filter, G filter, B filter and amber filter, respectively, in the $n^{th}$ number of the conversion table of color density—half-tone dot percent. The distance $S_A(n)$ between both the elements may be obtained by the equation:

$$[S_A(n)]^2 = [T_R(n) - D_R]^2 + [T_G(n) - D_G]^2 + [T_B(n) - D_B]^2 + [T_A(n) - D_A]^2$$

Since the distance $S_A(1)$ between the color density of color specimen and the 1st color density in the table is calculated for the first time, it is the minimum in Step $S_9$, and so said number n (i.e., the number 1 in this instance) and the calculated distance are stored in a predetermined address of RAM (Step $S_{10}$). The value is judged as to whether it is 0 or not with respect to the distance (Step $S_{11}$). If it is 0, the distance calculation with respect to the other color density stops at that time and the half-tone dot percent corresponding to that number is called up from the conversion table of color density—half-tone dot percent (Step $S_{13}$). If the distance is not 0, a combination of the 2nd color density is read from the conversion table of color density—half-tone dot percent and a similar distance calculation is performed to obtain the distance with respect to the color density of the color specimen, after which that distance is compared with the 1st distance being stored in RAM 111 (Step $S_9$), and the number n corresponding to the smaller distance and the distance are stored (Step $S_{10}$).

In this manner, unless the distance is 0, the color density of the color specimen is subjected to distance calculation with respect to all combinations of color densities of the conversion table of color density—half-tone dot percent to thereby obtain the combination-number n of color density of the smallest distance. Next, a combination of half-tone dot percents corresponding to that number n is extracted from the conversion table of color density—half-tone dot percent to thereby obtain the half-tone dot percents of color separations of Y, M, C and Bk of the measured color specimen.

Incidentally, the accuracy of the half-tone dot percent obtained in a manner as described above depends on with what accuracy the half-tone dot percent in the conversion table of color density—half-tone dot percent is prepared. Since in the example shown in FIG. 6, the half-tone dot percent is prepared so that it is varied at intervals of 10%, the accuracy is ±5%.

Accordingly, where a half-tone dot percent of higher accuracy is required, a conversion table of color density—half-tone dot percent of accuracy required can be prepared but if so prepared, there arises disadvantages, namely that data of the conversion stable of color density—half-tone dot percent becomes extremely increased, that it takes much time to prepare such data, and that a memory having a large memory capacity is not only required but it also takes time for comparison with the measured data of the color specimen.

Thus, in accordance with the present invention, the following method to which a new processing procedure is further added in addition to the first-mentioned method to obtain a half-tone dot percent of higher accuracy.

Figure 9:
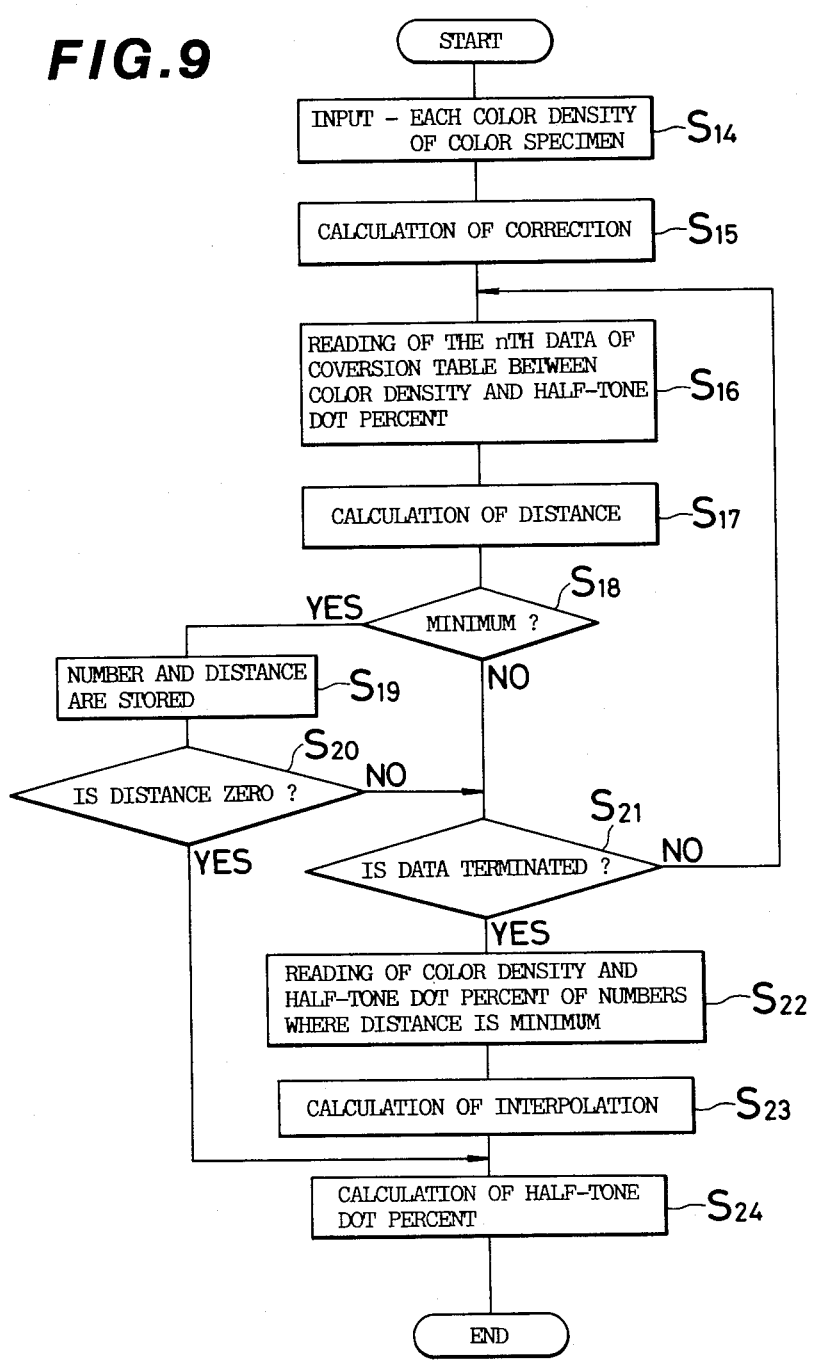
FIG. 9 is a flow chart showing the operation of a further method in accordance with the present invention.

FIG. 9 shows a flow chart showing the aforesaid processing procedure. Since Steps $S_{14}$ to $S_{21}$ can be executed exactly in the same manner as that of Steps of $S_5$ to $S_{12}$ in FIG. 7, further explanation will not be made. Also in the event the distance is 0, the half-tone dot percent of that number can be extracted from the table to complete processing in a similar manner. It is noted that a conversion table of color density—half-tone dot percent similar to that shown in FIG. 6 may be used.

As shown in FIG. 9, where the distance between a combination of color densities of the color specimen and a combination of color densities of the conversion table of color density—half-tone dot percent is not 0, the color density of the number wherein said distance is the smallest and the half-tone dot percent are read into CPU 110 from the conversion table of color density—half-tone dot percent (Step $S_{22}$), and an interpolation calculation is performed (Step $S_{23}$) whereby a half-tone dot percent of higher accuracy may be obtained.

One example of interpolation calculation will be described.

Let $t(T_R, T_G, T_B, T_A)$ be the combination of the aforesaid read color densities, P(c, m, y, bk) be the combination of half-tone dot percent, and $d(D_R, R_R, D_G, D_B, D_A)$ be the combination of color densities of color specimen. In this example, the half-tone dot percent is obtained in accuracy up to 1%.

Since in the conversion table of color density—half-tone dot percent stored in ROM 112, the half-tone dot percent is varied at intervals of 10%, a half-tone dot percent to be obtained is presently off either above or below by a half of 10%, namely, 5% of the half-tone dot percent of each color separation around P.

While in the following description, a description will be made while limiting a combination of half-tone dot percent to three colors, C, M and Y and not Bk for the sake of simplicity of explanation, it should be noted that the interpolation processing can be accomplished exactly in the same manner even for the case which does not exclude Bk.

Figure 10:
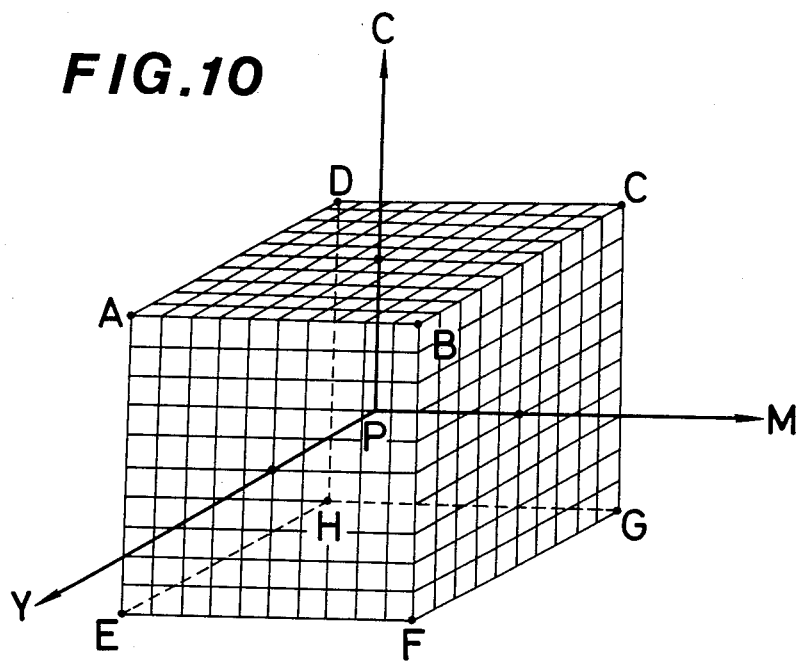
FIGS. 10 and 11 are, respectively, views for explaining a method of interpolation calculation in the C, M and Y coordinate systems.

FIG. 10 represents points wherein color separations of C, M and Y are deviated (±) 5% around P (c, m, y), in the C, M, Y coordinate system, each showing points of A(c+5, m−5, y+5), B(c+5, m+5, y+5), C(c+5, m+5, y−5), D(c+5, m−5, y−5), E(c−5, m−5, y±5), F(c−5, m+5, y+5), G(c−5, m+5, y+5) and H(c−5, m−5, y−5). The half-tone dot percent to be obtained is present in a color space with these points as vertices.

Thus, the color space is divided as shown in FIG. 10. For every necessary accuracy (1% in this case), a combination of color densities are obtained for every combination of half-tone dot percent shown by each grid point, and a point wherein the distance is the smallest is selected by the aforementioned formula used to obtain the distance of the color density whereby a combination of half-tone dot percents at that point can be determined as a combination of half-tone dot percents with accuracy increased.

However, the half-tone dot percents of the aforesaid points A, B, C, D, E, F, G and H have been known as previously mentioned but color densities corresponding thereto are not known.

Figure 11:
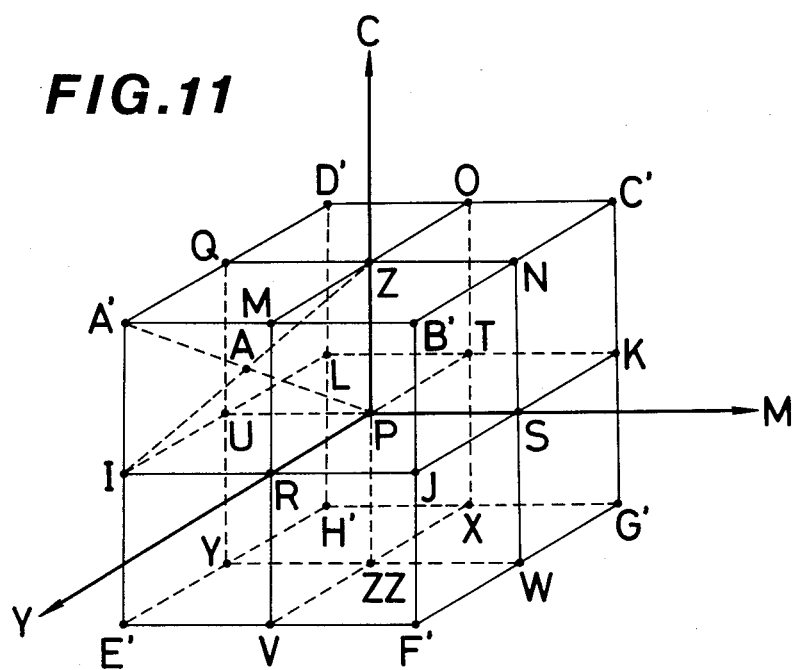

Then, a combination of color densities of points A'(c+10, m−10, y+10), B'(c+10, m+10, y+10), C'(c+10, m+10, y−10), D'(c+10, m−10, y−10), E'(c+10, m−10, y+10), F'(c−10, m+10, y+10), G'(c−10, m+10, y−10) and H'(c−10, m−10, y−10), which are away from P every 10%, as shown in FIG. 11, and middle points I(c, m−10, y+10), J(c, m+10, y+10), E(c, m+10, y−10), L(c, m−10, y−10), M(c+10, m, y+10), N(c+10, m+10, y), O(c+10, m, y−10), Q(c+10, m−10, y), R(c, m, y+10), S(c, m+10, y), T(c, m, y−10), U(c, m−10, y), V(c−10, m, y+10), W(c−10, m+10, y), X(c−10, m, y−10), Y(c−10, m−10, y), Z(c+10, m, y) and ZZ(c−10, m, y) can be known from the conversion table of color density—half-tone dot percent, and therefore, values of color densities of these points and a color density of point P are used to obtain a combination of color densities of the ponts A, B, C, D, E, F, G and H by interpolation calculation.

FIG. 11 shows positions of the points 10% away from the point P in the C, M, Y coordinate system which represents the half-tone dot percent.

First, a method for obtaining a combination of color densities at pont A(c+5, m−5, y+5) will be first explained. The point A is at a position of the center of the color space composed of points A'(c+10, m−10, y+10), M(c+10, m, y+10), Z(c+10, m, y), Q(c+10, m−10, y), I(c, m−10, y+10), R(c, m, y+10), P(c, m, y) and U(c, m−10, y) in FIG. 11. Thus, an average of every color density component of the points A', M, Z, Q, I, R, P and U is obtained, and that value is used as the color density component of the point A, that is, as the combination of color density of the point A.

Where the conversion table of color density—half-tone dot percent is not prepared by the equidistant half-tone dot percent, a color space composed of the points A', M, Z, Q, I, R, P and U is sometimes not a cubic body but a rectangular hexahedron, in which case, the distance of the point A from each vertex of the rectangular hexahedron is different, and therefore, a proportional formula or proper functions can be used according to the distance from each vertex.

Also, with respect to other points B, C, D, E, F, G and H, a combination of color densities therefor is calculated in a similar manner.

With respect to all of the points A, B, C, D, E, F, G and H, combinations of color densities therefor have been obtained as described above. Next, the values of color densities at these points are used, and a combination of color densities at each grid point, wherein a cubic body as shown in FIG. 10 is partitioned for every necessary interval, is obtained in a suitable method such as proportional distribution in a manner similar to that as previously mentioned. Then, the distance $S_A$ between the combination of color densities of the respective grid points thus obtained and a combination d ($D_R$, $D_G$, $D_B$) of color densities of color specimen is obtained by the aforementioned formula of the distance calculation to select a grid point wherein the distance $S_A$ is the smallest. Since the thus selected grid point has been already known in a combination of half-tone dot percents thereof, a combination of half-tone dot percents can be used as a combination of half-tone dot percents necessary for reproducing color assigned by the color specimen to thereby obtain the measured result of higher accuracy than that obtained by the aforementioned method.

It is noted that with respect to all areas of the points A, B, C, D, E, F, G and H as shown in FIG. 10, to obtain combinations of color densities of all grid points having the necessary accuracy requires much time since the number of grid points increases. Then, eight small color spaces wherein lines connecting the point P with respective vertices in FIG. 10 are diagonal lines are taken into consideration. In this way, a combination of color densities to be obtained is included in one of these small color spaces. Where the combination is included is judged and determined if the combination d ($D_R$, $D_G$, $D_B$) of color densities of color specimen is closest to the combination at what point among the combinations of color densities of the vertices A-H.

Once the small color space has been determined as described above, a combination of color densities of each grid point partitioned for every necessary accuracy with respect to only the small color space is obtained by interpolation, and a grid point closest to the combination d ($D_R$, $D_G$, $D_B$) of color densities of color specimen can be selected out of the combination of color densities of the grid points in said small color space. If this procedure is used, calculation time can be shortened by about an eighth.

Figure 12:
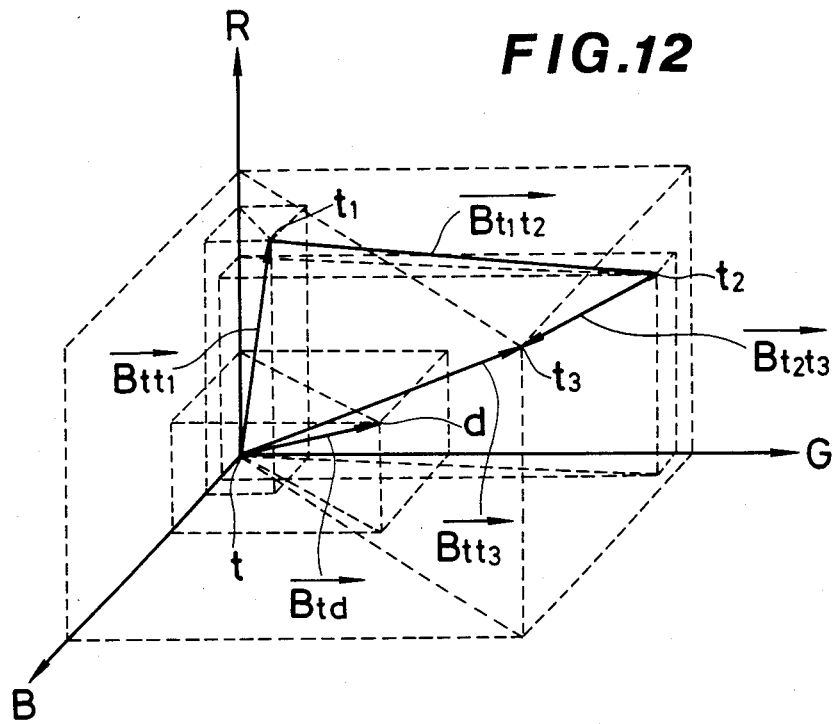
FIG. 12 is a view for explaining a further method of interpolation calculation in the R, G and B coordinate system.

FIG. 12 illustrates another interpolation method. In axes R, G and B, color densities obtained through the R, G and B filters, respectively, are represented with a combination t ($T_R$, $T_G$, $T_B$) of color densities wherein the distance relative to the color specimen is the smallest. Character d represents the point showing a combination ($D_R$, $D_G$, $D_B$) of color densities of the color specimen.

Here, when a vector $\vec{B_{td}}$ ($B_R$, $B_G$, $B_B$) is set, $B_R$ is equal to $D_R - T_R$ ($B_R = D_R - T_R$), $B_G = D_G - T_G$, and $B_B = D_B - T_B$.

Also, a combination of $P_3$ (c±10, m±10, y±10) of half-tone dot percents each deviated by one unit (that is, 10% in case of FIGS. 6(a) and 6(b)) relative to a combination P (c, m, y) of half-tone dot percents corresponding to the combination t of color densities is set, and a combination $t_3$ ($T_{R3}$, $T_{G3}$, $T_{B3}$) of color densities corresponding thereto can be known from the conversion table of color densities—half-tone dot percent.

To take plus or minus of the half-tone dot percent $P_3$ (c±10, m±10, Y±10) is determined by whether each component of the vector $\vec{B_{td}}$ ($B_R$, $B_G$, $B_B$) is above zero or below zero. If it is above zero, plus is used whereas if it is below zero, minus is used. In this case, symbols employed with respect to c±10, m±10, y±10, respectively, are determined by the respective symbols of $B_R$, $B_G$ and $B_B$.

When a vector $\vec{B_{tt3}}$ is taken into consideration, the vector $\vec{B_{tt3}}$ can be represented as a combination of several vectors.

While for the simplicity's sake, a description will be made assuming that each component of vector $B_{td}$ is larger than zero, it will be noted that a similar procedure can be used even in other cases.

Let $P_1$(c+10, m, y) and $P_2$(c+10, m+10, y) be the combinations of half-tone dot percent for the cases where component c is larger by 10% and component m is larger by 10%, respectively, relative to the combination P (c, m, y) of half-tone dot percent.

The combinations of color densities corresponding to the combinations $P_1$, $P_2$ of half-tone dot percent may be known as $t_1$($T_{R1}$, $T_{G1}$, $T_{B1}$) and $t_2$($T_{R2}$, $T_{G2}$, $T_{B2}$), respectively, from the conversion table of color density—half-tone dot percent.

Accordingly, the vector $\vec{B_{tt3}}$ may be represented as $\vec{B_{tt1}} + \vec{B_{t1t2}} + \vec{B_{t2t3}} = \vec{B_{tt3}}$ by the vectors $\vec{B_{tt1}}$, $\vec{B_{t1t2}}$ and $\vec{B_{t2t3}}$.

Thus, the vector $B_{td}$ is represented as $\alpha B_{tt1} + \beta B_{t1t2} + \gamma B_{t2t3} = B_{td}$ by $B_{tt1}$, $B_{t1t2}$ and $B_{t2t3}$.

Since the vector $B_{td}$($B_R$, $B_G$, $B_B$) is known in component as previously described, α, β and γ are obtained by the above-described formula.

Thus, a combination P' (c', m', y') of half-tone dot percents, wherein a combination P (c, m, y) of half-tone dot percents corresponding to t is interpolated relative to a combination of color densities selected as one which is the closest to the combination d ($D_R$, $D_G$, $D_B$) of color densities or color specimen, is as follows:

c' = c + α + 10 m' = m + β × 10 y' = y + γ × 10 because the table of FIGS. 6(a) and 6(b) is at intervals of 10%.

In the manner as described above, the combination P'(c', m', y') of half-tone dot percents after interpolation is determined.

It is noted that as a method for representing the vector $\vec{B_{tt3}}$ as a combination of other vectors, there are many other methods than that described above, and therefore, either vector can be used.

However, to obtain the reasonable interpolation value, it is preferable that a vector is selected so that a vector obtained by connecting a combination of color densities obtained from the conversion table of color density—half-tone dot percent, as shown in FIG. 12, reaches a combination $t_3$ of color densities.

If such a vector procedure is employed, processing time required for interpolation for obtaining a combination of half-tone dot percents of high accuracy as described above may be extremely shortened.

As previously mentioned in the description of prior art, where a color specified by the color specimen is a specially prepared color, there are some colors that may not be reproducible by color-printing using process ink. To what extent color is not producible can be grasped quantitatively by an extension of the above-described method, as described hereinafter.

It is assumed that a conversion table of color density—half-tone dot percent is prepared as shown in FIGS. 6(a) and 6(b) by the processing procedure shown in FIG. 5.

Figure 13:
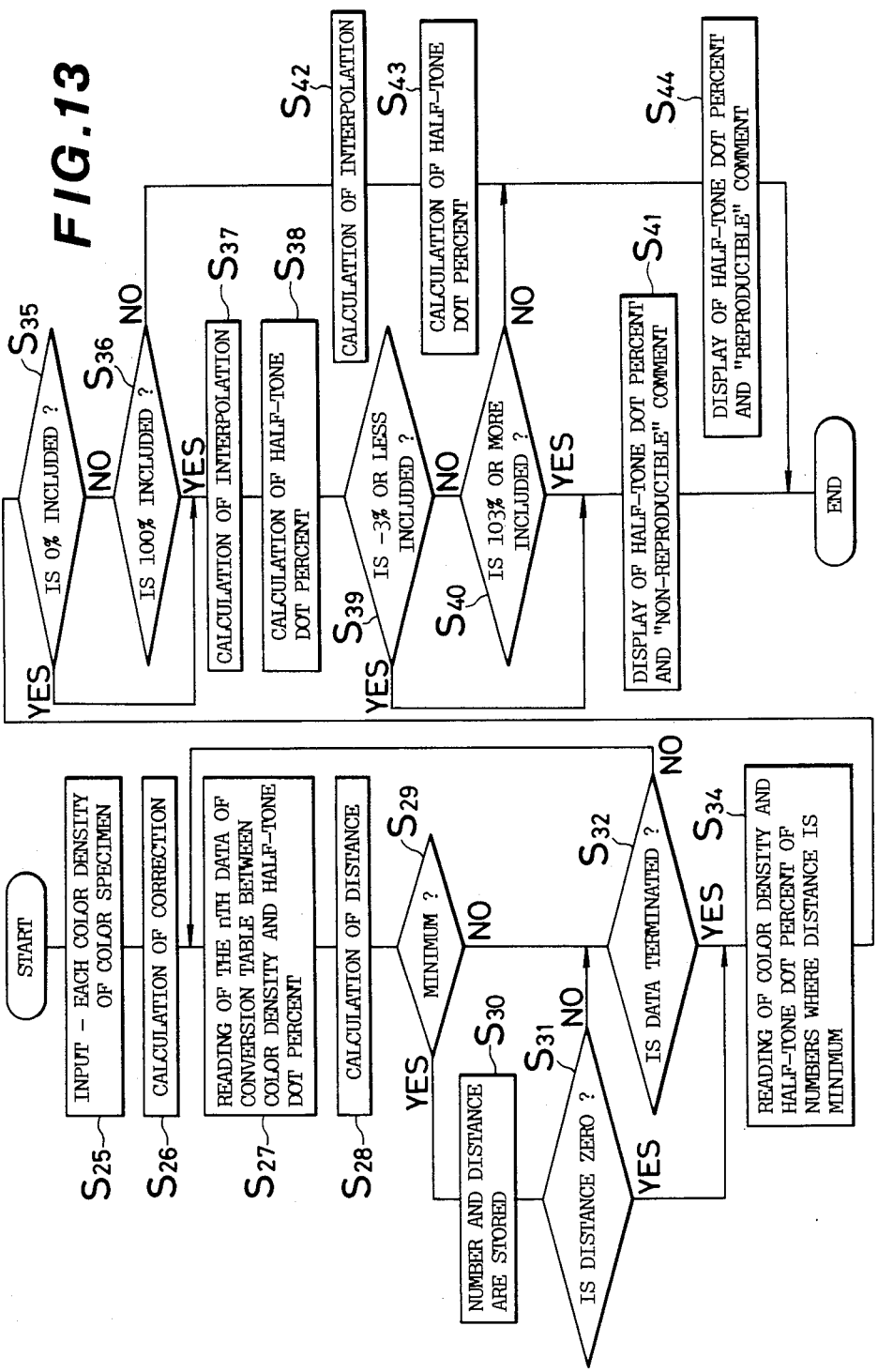
FIG. 13 is a flow chart showing the operation of the process in accordance with another method of the present invention.

FIG. 13 shows the processing procedure of this method. In this method, Steps $S_{25}$ to $S_{32}$ are similar to Steps $S_5$ to $S_{12}$ shown in FIG. 7, and therefore, explanation thereof will be omitted.

In Step $S_{34}$, a combination t($T_R$, $T_G$, $T_B$, $T_A$) of color densities of number (in which distance is 0 or smallest) most approximate to a combination d ($D_R$, $D_G$, $D_B$, $D_A$) of color densities of color specimen and a combination P (c, m, y, bk) of half-tone dot percents are read into CPU 110.

While in the following description, a description will be made while limiting a combination of half-tone dot percent to three colors, C, M and Y and not Bk for the sake of simplicity of explanation, it should be noted that the interpolation processing can be accomplished exactly in the same manner even in the case which does not exclude Bk.

Where individual half-tone dot percents c, m and y of a combination of half-tone dot percents having color density most approximate to the color density of color specimen are all present between 10 and 90%, they are present in a portion wherein the half-tone dot percent deviates above and below by 5% around P, that is, in a color space (FIG. 10) in accordance with the conception similar to that as already described. Thus, a color space surrounded by points A, B, C, D, E, F, G and H away by ±5% from P as shown in FIG. 10 is divided for every necessary accuracy. Color densities of grid points are obtained by interpolation, in a manner similar to that as described above, a combination of color densities thus interpolated is used to select a point where the distance is the smallest in the above-described formula of distance calculation, and the value of P is corrected by the value of said point to obtain a combination of half-tone dot percents which is satisfied with the necessary accuracy.

Where at least more than one color out of half-tone dot percents of the retrieved and selected point P are 0% or 100%, there is a possibility that a point showing the actual color is not present in the color space but rather is present outside the color space. Thus, it becomes necessary to consider a color space outside the chart, for example, a point of −10% or 110%. Briefly, the color density of a point of −10% may be obtained at the same proportion as variation from 10% to 0%, and likewise, the color density of a point of 110% may be obtained at the proportion of variation from 90% to 100%. For example, referring to FIG. 6, in the density value of a combination (−10, 100, 0) of half-tone dot percent, variation in density is (−0.09, −0.04, −0.07) from the density value (0.26, 1.39, 0.78) of a combination (10, 100, 0) of half-tone dot percents and the density value (0.17, 1.35, 0.71) of a combination (0, 100, 0) of half-tone dot percents. Thus, the density of the combination (−10, 100, 0) of half-tone dot percents to be obtained is (0.08, 1.31, 0.64) wherein the density value of the combination (0, 100, 0) of half-tone dot percents is varied as the proportion of that variation. Similarly, also in the point of 100%, the density of the point of 110% can be varied as the proportion is increased from 90% to 100%. While in the above-described embodiment, only variations from 10 to 0% or 90 to 100% have been obtained, it should be noted that functions are obtained at several points within the color space, for example, three points, 20, 10 and 0% to obtain the density of the point of −10%.

Furthermore, while in this description, a description has been made for the case where the half-tone dot percent of less than 0% or more than 100% is produced at intervals of 10%, it should be noted that it can be produced at other intervals, for example, at intervals of 5%.

Figure 14:
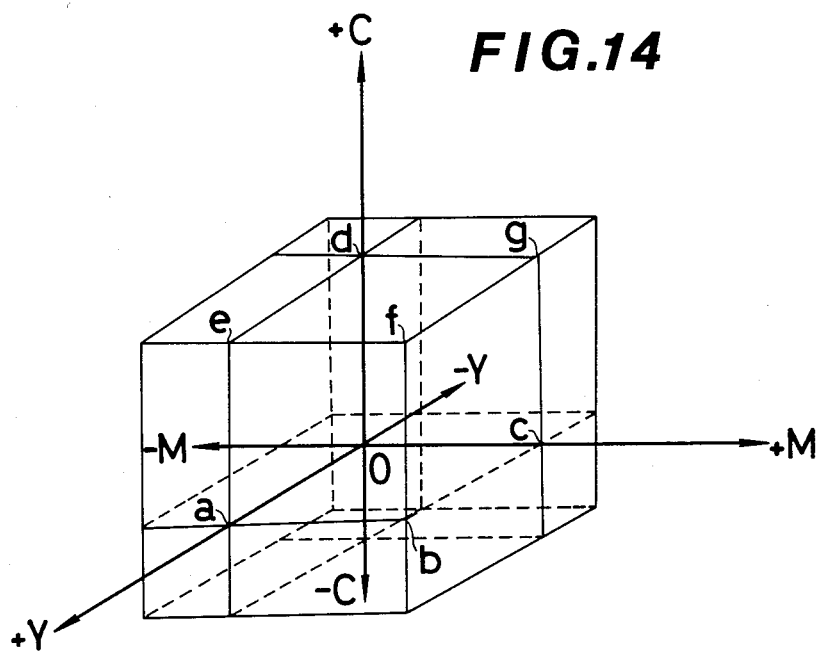
FIG. 14 illustrates a conception of the half tone dot percent in the C, M and Y coordinate systems.

A model view of the thus obtained expanded color space is shown in FIG. 14. In such a color space, which is divided for every necessary accuracy, a point where the distance is the smallest is selected by the aforementioned formula for obtaining the distance between a point indicated at each grid point and the measured value, and the half-tone dot percent of P can be interpolated by the value of the selected point (Steps S37, S38, S42 and S43).

With respect to colors that may be reproduced with predetermined ink, a combination of half-tone dot percents after interpolation must be in the color space, that is, the half-tone dot percent of each color has to be between 0 and 100%. Even if 1% is outside the color space unless an error such as a measured error of color density is present, it will be a color that may not be reproduced with predetermined ink. However, if a density value is employed as color information, the measuring accuracy is approximately ±0.02 in density value. When the density value is varied through 0.02 on the side where color is light, the half-tone dot percent varies by about 3%. Thus, as shown in Steps S39 and S40, even if the combination of half-tone dot percents after correction has a value outside the color space by about 3%, color can be judged to be a reproducible color. However, if there is a difference more than that as described, it can not be disregarded and color cannot be reproduced. The smaller than 0% or the larger than 100%, the further the combination is moved away from the color space. A a consequence, the fact that it is hard to reproduce it as the same color can be shown quantitatively.

Depending on whether or not the range controlled by the conversion table of color density—half-tone dot percent is present, that is, whether the combination of half-tone dot percents corrected in the aforementioned color space is present, the propriety of color reproduction of the color specimen by the predetermined ink can be discriminated by displaying the obtained half-tone dot percent (Steps S41 and S44).

It is noted that in the above-described methods, mere consideration has been taken in that the smallest half-tone dot percent is −10% and the largest is up to 110%. If the half-tone dot percent is limited to values from −10% to 100%, the measured color might be one far from that and may not be present in the expanded color space.

In this case, to what extent those far removed colors can be discriminated is as follows.

As described above, even if at least more than one color out of the half-tone dot percents of the retrieved and selected point P are 0% or 100%, a color space wherein the half-tone dot percent is deviated above and below by 10% around P is obtained, said color space being devided for every accuracy, a point where the distance is the smallest is selected by the aforementioned formula for obtaining the distance between the point shown by each grid point and the measured value, and the value of P is interpolated by the value of the combination of half-tone dot percents of the selected point to obtain a combination of half-tone dot percents which is satisfactorily within the necessary accuracy.

If more than one color out of the combination of the obtained half-tone dot percents are −10% or 110%, there is a possibility that the measured value is not present in the expanded color space. Thus, this time, a further expanded color space is determined with the corrected point set to P, and correction is performed in a similar manner to that so far performed. This procedure is repeatedly performed until the corrected point does not any longer assume a half-tone dot percent in a boundary surface in a further expanded color space to thereby obtain an accurate half-tone dot percent. The extent to which the half-tone dot percent after correction thus obtained is smaller or larger than 0% or 100% shows an amount distant from a color space that may be reproduced by predetermined ink, that is, a color space in the stage not expanded. This represents the extent that it may not be reproduced.

It is noted that even in the above-described processing, the half-tone dot percent can be obtained by the already described vector procedure.

A combination of half-tone dot percents obtained by measuring the color specimen as described above can also be displayed on the liquid crystal display 101 or be inputted into the external device 150 such as a scanner to directly place it at the reproduction worksite.

While in the above-described explanation, a description has been made of the case where color density was used as color information, it should be noted that even if chromaticity is used, the half-tone dot percent can be obtained in a similar way of thinking.

As described above, in the present invention, where a color assigned by a color specimen is reproduced by gathering-printing of ink of colors, for example, Y, M, C and Bk, the color specimen can be measured to accurately obtain a half-tone dot percent of each color separation.

In addition, even if a color assigned by a color specimen is not mono-color such as a secondary color or a trichromatic color, a half-tone dot percent of each color separation which is necessary for reproduction of such color may be obtained.

Moreover, even if a color assigned by a color specimen is a color which is difficult to reproduce by the gathering-printing using ink of colors, for example, Y, M, C and Bk, a half-tone dot percent of color separation of color most approximate to such color may be of course obtained, and in addition, the conception of the half-tone dot percent can be expanded to known to what extent reproduction is difficult.

What is claimed is:

1. A method of obtaining half-tone dot percents of color separations necessary for reproducing a color designated by a color specimen, comprising the steps of:

providing a plurality of color charts on which colors are printed using predetermined combinations of half-tone dot percents;

optically measuring said plurality of color charts to obtain color chart color information for each of said colors printed on said color charts;

inputting into a memory means for each of said colors said obtained color chart color information together with the corresponding predetermined combination of half-tone dot percent used to print said each of said colors to thereby create in said memory means a conversion table of color chart color information and a corresponding combination of half-tone dot percents for each of said colors printed on said color charts;

optically measuring a color specimen designating a color to be reproduced to obtain color information for said color to be reproduced;

successively comparing said color information obtained from said color specimen with said color chart color information in said conversion table and selecting the color chart color information from said conversion table which most closely corresponds to said color information obtained from said color specimen;

selecting the combination of half-tone dot percents corresponding to said selected color chart color information from said conversion table; and using the selected combination of half-tone dot percents for reproducing the color designated by said color specimen.

2. A method as claimed in claim 1, wherein said color information is selected from the group consisting of color density and chromaticity.

3. A method as claimed in claim 1, wherein said color information is color density, said color density being represented by a combination of four color densities obtained through a red filter, a green filter, a blue filter and a filter selected from the group consisting of an amber filter and an ND filter.

4. A method as claimed in claim 1, wherein said color information is color density, said color density being represented by a combination of three color densities obtained through a red filter, a green filter and a blue filter.

5. A method as claimed in claim 1, wherein said color separations comprise a combination of color separations of cyan, magenta, yellow and black.

6. A method as claimed in claim 1, wherein said step of inputting comprises inputting into said memory means said predetermined combinations of half-tone dot percents and said obtained color chart color information in a manner such that each inputted predetermined combination of half-tone dot percents is stored in said conversion table in said memory means so as to correspond to the inputted obtained color chart color information for the respective color printed using said each inputted predetermined combination of half-tone dot percents.

7. A method as claimed in claim 1, further including a correction step when reproduction is performed under printing conditions different from the printing conditions under which said color charts used to produce said conversion table were prepared, said correction step compensating for the difference between said two different conditions.

8. A method as claimed in claim 1, wherein said step of successively comparing is performed by calculating the distance between the color information obtained from the color specimen and each of the color chart color information in the conversion table, and selecting the color chart color information from said table for which said calculated distance is a minimum as the color chart color information which most closely corresponds to the color information obtained from the color specimen.

9. A method of obtaining half-tone dot percents of color separations necessary for reproducing a color designated by a color specimen, comprising the steps of:

providing a plurality of color charts on which colors are printed using predetermined combinations of half-tone dot percents;

optically measuring said plurality of color charts to obtain color chart color information for each of said colors printed on said color charts;

inputting into a memory means for each of said colors said obtained color chart color information together with the corresponding predetermined combination of half-tone dot percents used to print said each of said colors to thereby create in said memory means a conversion table of color chart color information and a corresponding combination of half-tone dot percents for each of said colors printed on said color charts;

optically measuring a color specimen designating a color to be reproduced to obtain color information for said color to be reproduced;

successively comparing said color information obtained from said color specimen with said color chart color information in said conversion table and selecting the color chart color information from said conversion table which most closely corresponds to said color information obtained from said color specimen;

determining if said selected color chart color information coincides with said color information obtained from said color specimen;

if said selected chart color information coincides with said color information obtained from said color specimen, selecting the combination of half-tone dot percents corresponding to said selected color chart color information from said conversion table, and using said selected combination of half-tone dot percents for reproducing the color designated by said color specimen; and if said selected color chart color information does not coincide with said color information obtained from said color specimen, performing an interpolation operation on the basis of the combination of half-tone dot percents in said conversion table corresponding to said selected color chart color information and a plurality of other combinations of half-tone dot percents selected from said conversion table to obtain an interpolated combination of half-tone dot percents corresponding to interpolated color chart color information which more closely corresponds to said color information obtained from said color specimen, and using said interpolated combination of half-tone dot percents for reproducing the color designated by said color specimen.

10. A method as claimed in claim 9, wherein said color information is selected from the group consisting of color density and chromaticity.

11. A method as claimed in claim 9, wherein said color information is color density, said color density being represented by a combination of four color densities obtained through a red filter, a green filter, a blue filter and a filter selected from the group consisting if an amber filter and an ND filter.

12. A method as claimed in claim 9, wherein said color information is color density, said color density being represented by a combination of three color densities obtained through a red filter, a green filter and a blue filter.

13. A method as claimed in claim 9, wherein said color separations comprise a combination of color separations of cyan, magenta, yellow and black.

14. A method as claimed in claim 9, wherein said step of inputting comprises inputting into said memory means said predetermined combinations of half-tone dot percents and said obtained color chart color information in a manner such that each inputted predetermined combination of half-tone dot percents is stored in said conversion table in said memory means so as to correspond to the inputted obtained color chart color information for the respective color printed using said each inputted predetermined combination of half-tone dot percents.

15. A method as claimed in claim 9, further including a correction step when reproduction is performed under printing conditions different from the printing conditions under which said color charts used to produce said conversion table were prepared, said correction step compensating for the difference between said two different conditions.

16. A method as claimed in claim 9, wherein said step of successively comparing is performed by calculating the distance between the color information obtained from the color specimen and each of the color chart color information in the conversion table, and selecting the color chart color information from said conversion table for which said calculated distance is a minimum as the color chart color information which most closely corresponds to the color information obtained from the color specimen.

17. A method as claimed in claim 9, wherein said step of performing an interpolation operation comprises the steps of: determining the combination of half-tone dot percents in said conversion table corresponding to said selected color chart color information; generating a plurality of interpolation combinations of half-tone dot percents in the vicinity of said determined combination of half-tone dot percents, said plurality of interpolation combinations being generated from said determined combination of half-tone dot percents and a plurality of combinations of half-tone dot percents in said conversion table which are in the vicinity of said determined combination of half-tone dot percents; obtaining interpolated color chart color information corresponding to each of said plurality of interpolation combinations of half-tone dot percents; calculating the distance between each of said interpolated color chart color information and the color information obtained from said color specimen; and selecting as said interpolated combination of half-tone dot percents the interpolation combination of half-tone dot percents corresponding to the interpolated color chart color information for which said calculated distance is a minimum.

18. A method as claimed in claim 9, wherein said step of performing an interpolation operation comprises the steps of: determining the combination of half-tone dot percents in said conversion table corresponding to said selected color chart color information; selecting a set of vectors to represent, with respect to said selected color chart color information, a plurality of color chart color information corresponding to a plurality of combinations of half-tone dot percents in said conversion table which are in the vicinity of said determined combination of half-tone dot percents; selecting an interpolation vector extending from said selected color chart color information to said color information obtained from said color specimen and representing said interpolation vector as a function of said selected set of vectors to obtain interpolation information; and using said interpolation information to obtain said interpolated combination of half-tone dot percents.

19. A method of obtaining half-tone dot percents of color separations necessary for reproducing a color designated by a color specimen, comprising the steps of:

storing a conversion table of color information and corresponding combinations of half-tone dot percents for reproducing colors represented by said color information in said conversion table;

optically measuring a color specimen designating a color to be reproduced to obtain color information for said color to be reproduced;

successively comparing said color information obtained from said color specimen with said color information in said conversion table and selecting the color information from said conversion table which most closely corresponds to said color information obtained from said color specimen;

selecting the combination of half-tone dot percents corresponding to said selected color information from said conversion table;

determining if a value of 0% is included in said selected combination of half-tone dot percents, and determining if a value of 100% is included in said selected combination of half-tone dot percents;

if at least one of said values of 0% and 100% is included in said selected combination of half-tone dot percents, producing an expanded conversion table which includes expanded combinations of half-tone dot percents and corresponding expanded color information, said expanded combinations of half-tone dot percents including a half-tone dot percent value below 0% when said selected combination of half-tone dot percents includes said value of 0% and including a half-tone dot percent value above 100% when said selected combination of half-tone dot percents includes said value of 100%, said expanded color information corresponding to said expanded combinations of half-tone dot percents being based upon the color information included in said conversion table;

performing an interpolation operation on the basis of said selected combination of half-tone dot percents and a plurality of other combinations of half-tone dot percents to obtain an interpolated combination of half-tone dot percents corresponding to interpolated color information which more closely corresponds to said color information obtained from said color specimen, said plurality of other combinations of half-tone dot percents being selected from said expanded conversion table when at least one of said values of 0% and 100% is included in said selected combination of half-tone dot percents and said plurality of other combinations of half-tone dot percents being selected from said conversion table when neither one of said values of 0% and 100% is included in said selected combination of half-tone dot percents; and using said interpolated combination of half-tone dot percents for reproducing the color designated by said color specimen.

20. A method as claimed in claim 19, wherein said color information is selected from the group consisting of color density and chromaticity.

21. A method as claimed in claim 19, wherein said color information is color density, said color density being represented by a combination of four color densities obtained through a red filter, a green filter, a blue filter and a filter selected from the group consisting of an amber filter and an ND filter.

22. A method as claimed in claim 19, wherein said color information is color density, said color density being represented by a combination of three color densities obtained through a red filter, a green filter and a blue filter.

23. A method as claimed in claim 19, wherein said color separations comprise a combination of color separations of cyan, magenta, yellow and black.

24. A method as claimed in claim 19, wherein said step of storing said conversion table comprises providing a plurality of prints on which colors are printed by use of color separations having predetermined combinations of half-tone dot percents, optically measuring said prints to obtain color information for said colors printed on said prints, inputting from a keyboard into a memory means for predetermined combinations of half-tone dot percents together with said color information obtained from said prints, and storing in said memory means said inputted color information and said inputted combinations of half-tone dot percents in a manner so as to create in said memory means said conversion table of color information and corresponding combinations of half-tone dot percents.

25. A method as claimed in claim 19, further including the step of producing said conversion table from a printed sample, and including a correction step when reproduction is performed under printing conditions different from the printing conditions under which the printed sample used to produce said conversion table was prepared, said correction step compensating for the difference between said two different conditions.

26. A method as claimed in claim 19, wherein said step of successively comparing is performed by calculating the distance between the color information obtained from the color specimen and each of the color information in the conversion table, and selecting the color information from said conversion table for which said calculated distance is a minimum as the color information which most closely corresponds to the color information obtained from the color specimen.

27. A method as claimed in claim 19, wherein said step of performing said interpolation operation comprises the steps of: generating a plurality of interpolation combinations of half-tone dot percents in the vicinity of said selected combination of half-tone dot percents, said plurality of interpolation combinations being generated from said selected combination of half-tone dot percents and a plurality of combinations of half-tone dot percents in said conversion table which are in the vicinity of said selected combination of half-tone dot percents; obtaining interpolated color information corresponding to each of said plurality of interplation combinations of half-tone dot percents; calculating the distance between each of said interpolated color information and the color information obtained from said color specimen; and selecting as said interpolated combination of half-tone dot percents the interpolation combination of half-tone dot percents corresponding to the interpolated color information for which said calculated distance is a minimum.

28. A method as claimed in claim 19, wherein said step of performing said interpolation operation comprises the steps of: selecting a set of vectors to represent, with respect to said selected color information, a plurality of color information in said conversion table corresponding to a plurality of combinations of half-tone dot percents in said conversion table which are in the vicinity of said selected combination of half-tone dot percents; selecting an interpolation vector extending from said selected color information to said color information obtained from said color specimen and representing said interpolation vector as a function of said selected set of vectors to obtain interpolation information; and using said interpolation information to obtain said interpolated combination of half-tone dot percents.

29. A method as claimed in claim 19, further including the steps of: if at least one of said values of 0% and 100% is included in said selected combination of half-tone dot percents, determining if at least one of the half-tone dot percents of said expanded combinations of half-tone dot percents is included in said interpolated combination of half-tone dot percents; and if at least one of the half-tone dot percents of said expanded combinations of half-tone dot percents is included in said interpolated combination of half-tone dot percents, producing a further expanded conversion table which includes further expanded combinations of half-tone dot percents and corresponding further expanded color information, said further expanded color information being based upon the expanded color information included in said expanded conversion table, and conducting a further interpolation operation on the basis of said interpolated combination of half-tone dot percents and a plurality of other combinations of half-tone dot percents selected from said further expanded conversion table to obtain a further interpolated combination of half-tone dot percents corresponding still more closely to said color information obtained from said color specimen; and wherein said step of using comprises using said further interpolated combination of half-tone dot percents for reproducing the color designated by said color specimen.

30. A method as claimed in claim 19 wherein said expanded color information corresponding to said expanded combinations of half-tone dot percents which include a half-tone dot percent value below 0% are obtained in accordance with the rate of change of said color information in said conversion table between the color information for a half-tone dot percent above 0% and the color information for a half-tone dot percent of 0%, and wherein said color information corresponding to said expanded combinations of half-tone dot percents which include a half-tone dot percent value above 100% are obtained in accordance with the rate of change of said color information in said conversion table between the color information for a half-tone dot percent below 100% and the color information for a half-tone dot percent of 100%.

31. An apparatus for obtaining half-tone dot percents of color separations necessary for reproducing a color designated by a color specimen, comprising:

optical measuring means for optically measuring a plurality of color charts on which colors are printed using predetermined combinations of half-tone dot percents and for optically measuring a color specimen designating a color to be reproduced, said optical measuring means being operative to obtain color information for each of said colors printed on said color charts and for said color designated by said color specimen;

memory means for storing information inputted into said memory means;

inputting means for inputting into said memory means, for each of said colors, said obtained color information together with the corresponding predetermined combination of half-tone dot percents used to print said each of said colors to thereby create a conversion table of color information and a corresponding combination of half-tone dot percents for each of said colors printed on said color charts;

means for successively comparing said color information obtained from said color specimen with said color information in said conversion table and for selecting the color information from said conversion table which most closely corresponds to said color information obtained from said color specimen;

selecting means for selecting the combination of half-tone dot percents corresponding to said selected color information from said conversion talbe; and means for displaying said selected combination of half-tone dot percents.

32. An apparatus according to claim 31, further comprising means for performing an interpolation operation on the basis of said selected combination of half-tone dot percents and a plurality of other combinations of half-tone dot percents selected from said conversion table when said selected color information does not coincide with said color information obtained from said color specimen to obtain an interpolated combination of half-tone dot percents corresponding to interpolated color information which more closely corresponds to said color information obtained from said color specimen, and wherein said means for displaying is operative to display said selected combination of half-tone dot percents when said selected color information coincides with said color information obtained from said color specimen and is operative to display said interpolated combination of half-tone dot percents when said selected color information does not coincide with said color information obtained from said color specimen.

33. An apparatus according to claim 31, further comprising means for determining if a value of 0% is included in said selected combination of half-tone dot percents and for determining if a value of 100% is included in said selected combination of half-tone dot percents; and means for producing an expanded conversion table including expanded combinations of half-tone dot percents and corresponding expanded color information if at least one of said values of 0% and 100% is included in said selected combination of half-tone dot percents, said expanded combinations of half-tone dot percents including a half-tone dot percent value below 0% when said selected combination of half-tone dot percents includes said value of 0% and including a half-tone dot percent value above 100% when said selected combination of half-tone dot percents includes said value of 100%.

34. An apparatus according to claim 31, wherein said inputting means includes keyboard means for inputting into said memory means said predetermined combinations of half-tone dot percents and said obtained color information in a manner such that each inputted predetermined combination of half-tone dot percents is stored in said memory means in said conversion table in said memory means so as to correspond to the inputted obtained color information for the respective color printed using said each inputted predetermined combination of half-tone dot percents.

* * * * *

UNITED STATES PATENT AND TRADEMARK OFFICE
CERTIFICATE OF CORRECTION

PATENT NO. : 4,717,954

DATED : January 5, 1988

INVENTOR(S) : Fujita et al.

It is certified that error appears in the above-identified patent and that said Letters Patent is hereby corrected as shown below:

Column 1, line 5, "HALF-TIME" should read --HALF-TONE--.
         line 35, "matters" should read --matter--.
         line 43, "fine" should read --find--.

Column 2, line 37, delete "thus".
         line 38, after "value," insert --thus--.

Column 3, line 13, "pringing" should read --printing--.

Column 6, line 26, "presented" should read --present--.

Column 9, line 26, "eac" should read --each--.

Column 11, line 7, delete "$R_R$,".
          line 29, "y±5" should read --y+5--.

line 29, "y+5" (second occurrence) should read --y-5--.

line 50, "c+10" should read --c-10--.

Column 13, line 51, "$B_{td}$" should read --$\vec{B}_{td}$--.

UNITED STATES PATENT AND TRADEMARK OFFICE
CERTIFICATE OF CORRECTION

PATENT NO. : 4,717,954

DATED : January 5, 1988

INVENTOR(S) : Fujita et al.

It is certified that error appears in the above-identified patent and that said Letters Patent is hereby corrected as shown below:

Column 13, line 52, "$aB_{tt1}$" should read --$\overrightarrow{\alpha B_{tt1}}$--; "$\beta B_{t1t2}$" should read --$\overrightarrow{\beta B_{t1t2}}$--; "$\gamma B_{t2t3}$" should read --$\overrightarrow{\gamma B_{t2t3}}$--; "$B_{td}$" should read --$\overrightarrow{B_{td}}$--; "$B_{tt1}$" should read --$\overrightarrow{B_{tt1}}$--; "$B_{t1t2}$" should read --$\overrightarrow{B_{t1t2}}$--; and "$B_{t2t3}$" should read --$\overrightarrow{B_{t2t3}}$--.

line 53, "$B_{td}$" should read --$\overrightarrow{B_{td}}$--.

line 61, "or" should read "of"

line 62, "c'= c + a + 10" should read --c'= C + $\alpha$ x 10--.

Column 17, line 9, "known" should read --know--.
line 24, "percent" should read --percents--.

UNITED STATES PATENT AND TRADEMARK OFFICE
CERTIFICATE OF CORRECTION

PATENT NO. : 4,717,954

DATED : January 5, 1988

INVENTOR(S) : Fujita et al.

It is certified that error appears in the above-identified patent and that said Letters Patent is hereby corrected as shown below:

Column 19, line 17, "if" should read --of--.

Column 23, line 43, "talbe" should read --table--.

Column 24, line 42, delete "in said memory means".

Signed and Sealed this

Twenty-eighth Day of June, 1988

Attest:

Attesting Officer

DONALD J. QUIGG

Commissioner of Patents and Trademarks